(12) United States Patent
Bokka et al.

(10) Patent No.: US 10,984,990 B2
(45) Date of Patent: Apr. 20, 2021

(54) ELECTRODE ASSEMBLY

(71) Applicant: Applied Materials, Inc., Santa Clara, CA (US)

(72) Inventors: Ramesh Bokka, Milpitas, CA (US); Jason M. Schaller, Austin, TX (US); Jay D. Pinson, II, San Jose, CA (US); Luke Bonecutter, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 218 days.

(21) Appl. No.: 15/955,290

(22) Filed: Apr. 17, 2018

(65) Prior Publication Data
US 2018/0308669 A1 Oct. 25, 2018

Related U.S. Application Data

(60) Provisional application No. 62/488,459, filed on Apr. 21, 2017.

(51) Int. Cl.
*H01J 37/32* (2006.01)
*C23C 16/458* (2006.01)
(Continued)

(52) U.S. Cl.
CPC .... *H01J 37/32724* (2013.01); *C23C 16/4586* (2013.01); *C23C 16/463* (2013.01); *C23C 16/50* (2013.01); *C23C 16/503* (2013.01); *C23C 16/509* (2013.01); *C23C 16/517* (2013.01); *H01J 37/321* (2013.01); *H01J 37/3244* (2013.01); *H01J 37/32743* (2013.01); *H01L 21/67103* (2013.01); *H01L 21/67248* (2013.01); *H01L 21/6831* (2013.01); *H01L 21/6833* (2013.01); *H01J 2237/002* (2013.01); *H01J 2237/334* (2013.01);
(Continued)

(58) Field of Classification Search
None
See application file for complete search history.

(56) References Cited

U.S. PATENT DOCUMENTS 6,222,718 B1 4/2001 Dible
2002/0004309 A1* 1/2002 Collins ............... H01J 37/3266
438/719
(Continued)

FOREIGN PATENT DOCUMENTS

JP H5-291194 A 11/1993
WO 2009-137405 A2 11/2009

OTHER PUBLICATIONS

International Search Report and Written Opinion dated Jul. 6, 2018 for Application No. PCT/US2018/024930.
(Continued)

*Primary Examiner* — Jethro M. Pence
(74) *Attorney, Agent, or Firm* — Patterson + Sheridan, LLP

(57) ABSTRACT

A plasma processing apparatus is provided including a radio frequency power source; a direct current power source; a chamber enclosing a process volume; and a substrate support assembly disposed in the process volume. The substrate support assembly includes a substrate support having a substrate supporting surface; an electrode disposed in the substrate support; and an interconnect assembly coupling the radio frequency power source and the direct current power source with the electrode.

13 Claims, 5 Drawing Sheets

(51) Int. Cl.
    *C23C 16/50*     (2006.01)
    *H01L 21/67*     (2006.01)
    *H01L 21/683*     (2006.01)
    *C23C 16/503*     (2006.01)
    *C23C 16/517*     (2006.01)
    *C23C 16/509*     (2006.01)
    *C23C 16/46*     (2006.01)

(52) U.S. Cl.
    CPC .................. *H01J 2237/3321* (2013.01); *H01J 2237/3323* (2013.01); *H01L 21/67069* (2013.01)

(56) References Cited

U.S. PATENT DOCUMENTS

| | | |
|---|---|---|
| 2009/0274590 A1 | 11/2009 | Willwerth et al. |
| 2010/0018648 A1 | 1/2010 | Collins et al. |
| 2010/0099266 A1 | 4/2010 | Oswald et al. |
| 2011/0155058 A1* | 6/2011 | Carlson .................. C23C 16/46 118/722 |
| 2011/0297650 A1 | 12/2011 | Tavassoli et al. |
| 2012/0132397 A1 | 5/2012 | Silveira et al. |
| 2014/0302256 A1 | 10/2014 | Chen et al. |

OTHER PUBLICATIONS

Japanese Office Action dated Jan. 5, 2021 for Application No. 2019-556804.

\* cited by examiner

ELECTRODE ASSEMBLY

CROSS-REFERENCE TO RELATED APPLICATIONS

This application claims benefit of U.S. provisional patent application Ser. No. 62/488,459, filed Apr. 21, 2017, which is hereby incorporated herein by reference.

BACKGROUND

Field

Embodiments of the present disclosure generally relate to an apparatus and method for processing substrates.

Description of the Related Art

In the manufacture of integrated circuits and other electronic devices, plasma processes are often used for deposition or etching of various material layers. High frequency power, such as a radio frequency (RF) power, is often used to generate the plasma, for example inside a process chamber. The RF power can be applied to one or more portions of the process chamber, such as the gas distribution assembly of the process chamber or a substrate support in the process chamber. When RF power is applied to the substrate support, a direct current (DC) bias is also often applied to the substrate support to chuck the substrate to the substrate support during processing.

Generally, plasma processing offers many advantages over thermal processing. For example, plasma enhanced chemical vapor deposition (PECVD) allows deposition processes to be performed at lower temperatures and at higher deposition rates than in analogous thermal processes. However, some plasma processes are performed at elevated temperatures, such as greater than 200° C., for example temperatures from about 300° C. to about 500° C.

Using conventional RF systems, such as RF systems that apply RF power and a DC bias to the substrate support, at temperatures greater than 200° C. can cause problems to arise. For example, the effect of providing RF power (e.g., applied to the substrate support) to various chamber processing components during processing has on other processing components and operations, such as the application of a DC bias and resistive heating of the substrate support, increase with increasing temperature. In general, the dielectric properties of various insulating materials used to electrically isolate the RF powered and the non-RF powered components degrades with an increase in temperature, thus making it necessary to find improved ways of preventing the various process chamber components from becoming damaged during the plasma processing due to the application of RF power to various chamber components during high temperature plasma processing. For example, attempting to use substrate supports that are used in conventional RF chambers can result in delamination of the dielectric material disposed on the RF biased electrode found at the upper surface of the substrate supporting surface of the pedestal.

Therefore, there is a need for an improved method and apparatus for plasma processing at elevated temperatures.

SUMMARY

Embodiments of the disclosure generally relate to a plasma processing apparatus and methods of using the same. In one embodiment, a plasma processing apparatus is provided including a radio frequency power source; a direct current power source; a chamber enclosing a process volume; and a substrate support assembly disposed in the process volume. The substrate support assembly includes a substrate support having a substrate supporting surface; an electrode disposed in the substrate support; and an interconnect assembly coupling the radio frequency power source and the direct current power source with the electrode.

In another embodiment, a substrate support assembly is provided including a substrate support having a substrate supporting surface; an electrode disposed in the substrate support; and an interconnect assembly comprising a first conductive rod, a second conductive rod, and an interconnect connecting the first conductive rod and the second conductive rod with the electrode.

In another embodiment, a plasma processing apparatus is provided including a radio frequency power source; a direct current power source; a chamber enclosing a process volume; and a substrate support assembly disposed in the process volume. The substrate support assembly includes a substrate support having a substrate supporting surface; an electrode disposed in the substrate support; and an interconnect assembly coupling the radio frequency power source and the direct current power source with the electrode. The plasma processing apparatus further includes a cooling assembly, and the substrate support assembly further includes a channel coupled to the cooling assembly and the cooling assembly is configured to direct a cooling fluid to flow through the channel. The plasma processing apparatus further includes a gas source, wherein the substrate support assembly further comprises a conduit coupling the gas source to the substrate supporting surface. The plasma processing apparatus further includes a pyrometer having a light pipe extending through the conduit to the substrate supporting surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

Figure 1:
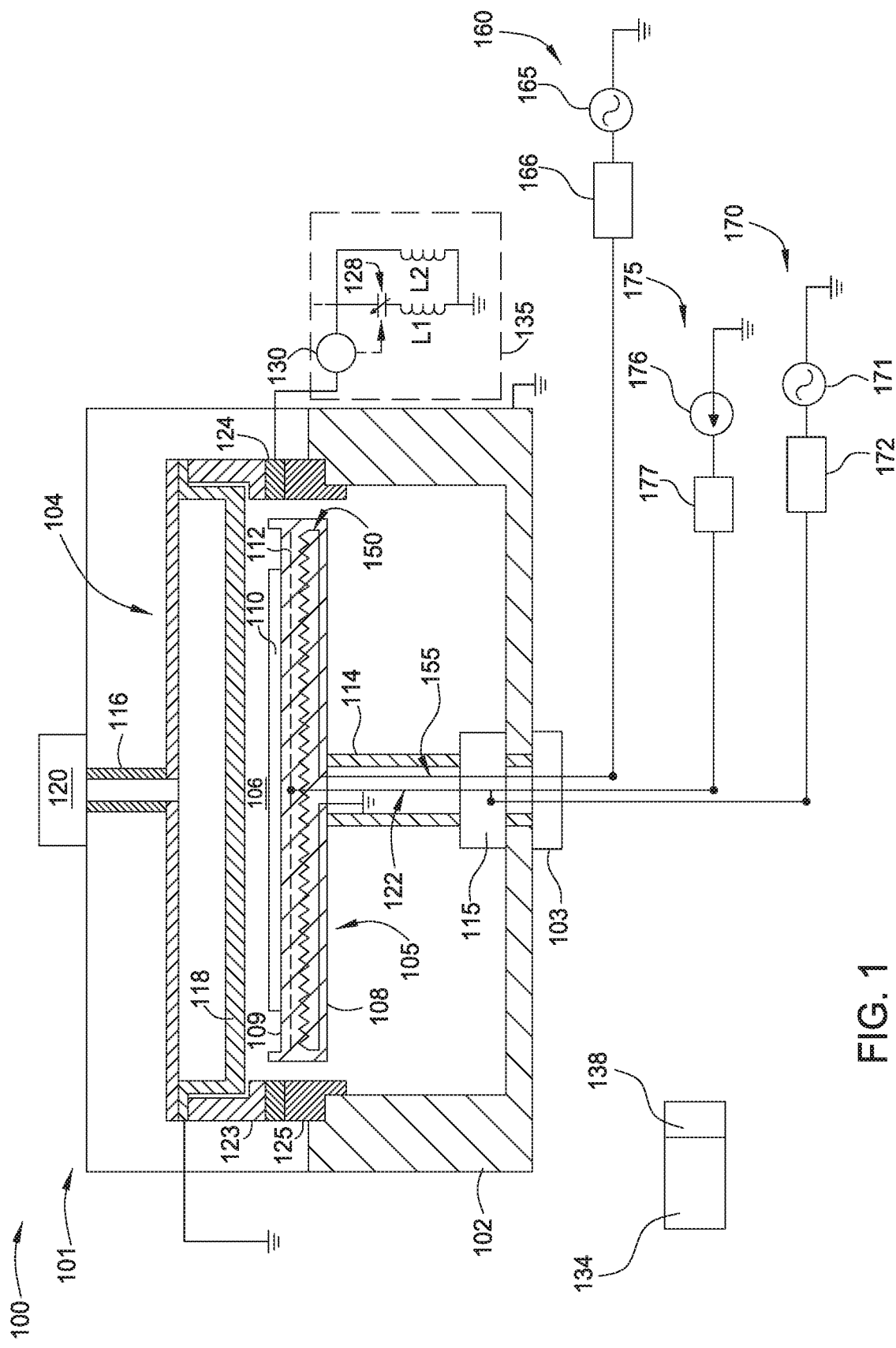
FIG. 1 is a schematic side cross-sectional depiction of a plasma processing apparatus, according to one embodiment.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding technical field, background, brief summary or in the following detailed description.

FIG. 1 is a schematic side cross-sectional depiction of a plasma processing apparatus 100, according to one embodiment. The apparatus includes a chamber 101 in which one or more films may be deposited on a substrate 110 or alternatively etched from the substrate 110 disposed in the chamber 101. The chamber 101 includes a chamber body 102, a substrate support assembly 105, and a gas distribution assembly 104, which distributes gases uniformly into a process volume 106 of the chamber 101. The substrate support assembly 105 includes a substrate support 108, a base 115, a stem 114 connecting the base 115 to the substrate support 108, and a drive system 103. The substrate support assembly 105 is disposed within the process volume 106. In some embodiments, the substrate support 108 can be a pedestal. The substrate support 108 has a substrate supporting surface 109 that supports the substrate 110 when the substrate 110 is disposed in the chamber 101. The substrate support 108 can be movably disposed in the process volume 106 by the stem 114 that extends through the chamber body 102. The stem 114 and base 115 can be connected to the drive system 103 and a bellows (not shown) to allow the substrate support 108 to be raised, lowered, and/or rotated.

The substrate support assembly 105 further includes an electrode 112 disposed in the substrate support 108. The electrode 112 is electrically connected to RF power to generate an electric field in the process volume 106 to create the plasma to process the substrate 110 as described below. Furthermore, in some embodiments, the electrode 112 can also be electrically connected to a DC power to create a DC bias that can be used to electrostatically chuck the substrate 110 to the substrate support 108 during processing as described below. In one embodiment, the electrode 112 comprises a conductive mesh, such as a tungsten or a molybdenum containing conductive mesh that is disposed within a dielectric material that is used to form the bulk of the substrate support 108. The substrate support 108 can be formed of a ceramic material, such as aluminum nitride (AlN), silicon nitride (SiN), silicon carbide (SiC) or the like. The stem 114 may be formed of an insulative material, such as a ceramic (e.g., AlN, SiC, quartz). The base 115 may be constructed of a material, such as aluminum, stainless steel, or other desirable material.

The plasma processing apparatus 100 further includes an RF circuit 170 electrically coupled to the electrode 112. The substrate support assembly 105 further includes a conductive rod 122 electrically connecting the RF circuit 170 to the electrode 112. The RF circuit 170 can be configured to generate an electric field in the process volume 106 to create the plasma within the process volume 106 to process the substrate 110. The electric field can be generated between the electrode 112 in the substrate support 108 and the gas distribution assembly 104, which is connected to an electrical ground. The RF circuit 170 can include an RF power source 171 and a match circuit 172 coupled between the RF power source 171 and the electrode 112. In some embodiments, the RF power source 171 can supply RF power at 13.56 MHz. In other embodiments, the RF power source 171 can supply RF power at 60 MHz. In still other embodiments, the RF power source 171 can be configured to supply 13.56 MHz and/or 60 MHz. The RF power source 171 can be configured to supply the RF power at power from about 100 Watts to about 5000 Watts, such as about 100 Watts to about 1000 Watts, or even between about 200 Watts and about 600 Watts. The match circuit 172 can be configured to control the plasma load impedance between about 25 Ohms and about 100 Ohms, such as about 50 Ohms.

The plasma processing apparatus 100 further includes a DC circuit 175 electrically coupled to the electrode 112. The conductive rod 122 can electrically couple the DC circuit 175 to the electrode 112. Thus, the conductive rod 122 can electrically couple both the RF circuit 170 and the DC circuit 175 to the electrode 112. The DC circuit 175 can be used to electrostatically chuck the substrate 110 to the substrate support 108 during processing. The DC circuit 175 includes a DC power source 176 and an RF filter 177 coupled between the DC power source 176 and the electrode 112. The RF filter 177 can be used to protect the DC power source 176 from the high frequency power from the RF circuit 170. The DC power source 176 can be configured to generate a positive or negative DC voltage. For example, in some embodiments, the DC power source can be configured to generate a DC voltage from about +10k VDC to about −10k VDC, such as from about +5k VDC to about −5k VDC, such as from about +2k VDC to about −2k VDC. The RF circuit 170 and the DC circuit 175 are each coupled to the electrode 112 through an interconnection assembly 230 (see FIG. 2) in the base 115 of the substrate support assembly 105 as described below.

The substrate support assembly 105 further includes a plurality of heating elements 150 disposed in the substrate support 108. Although the substrate support assembly 105 is described as including a plurality of heating elements 150, some embodiments of the substrate support assembly may only include a single heating element. In some embodiments, as depicted, the plurality of heating elements 150 may be disposed beneath the electrode 112 allowing the electrode 112 to be disposed closer to the substrate 110 than the plurality of heating elements 150. The plurality of heating elements 150 generally provide resistive heating to the substrate 110, and may include any feasible material, such as a conductive metal wire (e.g., refractory metal wire), patterned metal layer (e.g., molybdenum, tungsten or other refractory metal layer) or other similar conductive structure. The plasma processing apparatus 100 can further include a heating circuit 160 electrically coupled to the plurality of heating elements 150. The substrate support assembly 105 can further include plurality of conductive rods 155 electrically connecting the heating circuit 160 to the plurality of heating elements 150. The heating circuit 160 can further include an RF filter 166 coupled between the heating power source 165 and the plurality of heating elements 150. The RF filter 166 can be used to protect the heating power source 165 from the high frequency power from the RF circuit 170.

The plasma processing apparatus 100 further includes the gas distribution assembly 104 introduced above. The gas distribution assembly 104 includes a gas inlet passage 116, which delivers gas from a gas flow controller 120 into a gas distribution manifold 118. The gas distribution manifold 118 includes a plurality of holes or nozzles (not shown) through which gaseous mixtures are injected into the process volume 106 during processing. The gas distribution assembly 104 can be connected to an electrical ground to allow RF energy applied to the electrode 112 in the substrate support 108 to generate the electric field within the process volume 106, which is used to generate the plasma for processing of the substrate 110.

The chamber 101 can optionally further include a ceramic ring 123, an isolator 125, and a tuning ring 124. The ceramic ring 123 is positioned below the gas distribution manifold 118. In some embodiments, the gas distribution manifold 118 can be disposed directly on the ceramic ring 123. The isolator 125 is disposed around the substrate support 108 on a ledge of the chamber body 102. The tuning ring 124 is disposed between the ceramic ring 123 and the isolator 125, which electrically isolates the tuning ring 124 from the chamber body 102. The tuning ring 124 is typically made from a conductive material, such as aluminum, titanium, or copper. As depicted in FIG. 1, the optional tuning ring 124 is positioned concentrically about the substrate support 108 and substrate 110 during processing of the substrate 110.

The plasma processing apparatus 100 further includes an optional first RF tuner 135. The optional tuning ring 124 is electrically coupled to the first RF tuner 135. The first RF tuner 135 includes a variable capacitor 128, such as a variable vacuum capacitor, that is terminated to ground through an inductor L1. The first RF tuner 135 also includes a second inductor L2 that is electrically coupled in parallel to the variable capacitor 128 to provide a path for low frequency RF to ground. The first RF tuner 135 also includes a sensor 130, such as a voltage/current (V/I) sensor, that is positioned between the tuning ring 124 and the variable capacitor 128 for use in controlling the current flow through the tuning ring 124 and the variable capacitor 128.

A system controller 134 controls the functions of the various components, such as the drive system 103, the variable capacitor 128, the heating power source 165, the RF power source 171, and the DC power source 176. The system controller 134 executes system control software stored in a memory 138. The system controller 134 comprises parts of or all of one or more integrated circuits (ICs) and/or other circuitry components. The system controller 134 may in some cases include a central processing unit (CPU) (not shown), internal memory (not shown), and support circuits (or I/O) (not shown). The CPU may be one of any form of computer processor that is used for controlling various system functions and support hardware and monitoring the processes being controlled by and within the chamber 101. The memory is coupled to the CPU, and may be one or more of a readily available memory, such as random access memory (RAM), read only memory (ROM), floppy disk, hard disk, or any other form of digital storage, local or remote. Software instructions (or computer instructions) and data may be coded and stored within the memory for instructing the CPU. The software instructions may include a program that determines which tasks are to be performed at any instant in time. The support circuits are also connected to the CPU for supporting the processor in a conventional manner. The support circuits may include cache, power supplies, clock circuits, timing circuits, input/output circuitry, subsystems, and the like.

In the chamber 101 of the plasma processing apparatus 100, an RF path is established between the powered electrode 112 and the grounded gas distribution manifold 118 via the generated plasma. In some embodiments, the RF circuit 170 may further include a variable capacitor (not shown) allowing the impedance for the RF path through the electrode 112 to be adjusted. The adjusted impedance can cause a change in the RF field coupled to the gas distribution manifold 118 and a corresponding change in the RF return current through the gas distribution manifold 118. Therefore, the plasma in the process volume 106 may be modulated across the surface of the substrate 110 during plasma processing. Controlling the RF field and modulating the RF return current may thus result in higher processing rate in depositing films onto or etching material from the substrate 110 with improved center-to-edge deposition thickness uniformity or etch removal uniformity.

Furthermore, in some embodiments, an additional RF path is established between the electrode 112 and the tuning ring 124. Additionally, by changing the capacitance of the variable capacitor 128, the impedance for the RF path through the tuning ring 124 changes, in turn, causing a change in the RF field coupled to the tuning ring 124. For example, a maximum current and corresponding minimum impedance of the tuning ring 124 can be achieved by varying the total capacitance of the variable capacitor 128. Therefore, the plasma in the process volume 106 may also be modulated across the surface of the substrate 110 using this additional RF path.

Since the plurality of heating elements 150 may be embedded beneath the electrode 112, RF energy can also capacitively couple through the ceramic materials of the substrate support 108 to the heating elements 150 (i.e., RF leakage currents). The RF leakage through these undesired paths, such as heating elements 150 and conductive rod 155, not only affects the substrate processing results (e.g., deposition rate and uniformity on the substrate) but also can cause electromagnetic interference (EMI) on or damage to the heating power source 165.

The RF filters 166 may be included in the heating assembly to provide a relatively greater impedance path to ground to minimize the amount of RF leakage to the heating elements 150 any related EMI that reaches the heating power source 165. The RF filters 166 may be inserted in between the plurality of heating elements 150 and the heating power source 165 to attenuate or to suppress RF leakage currents being transmitted to the heating power source 165.

Figure 2A:
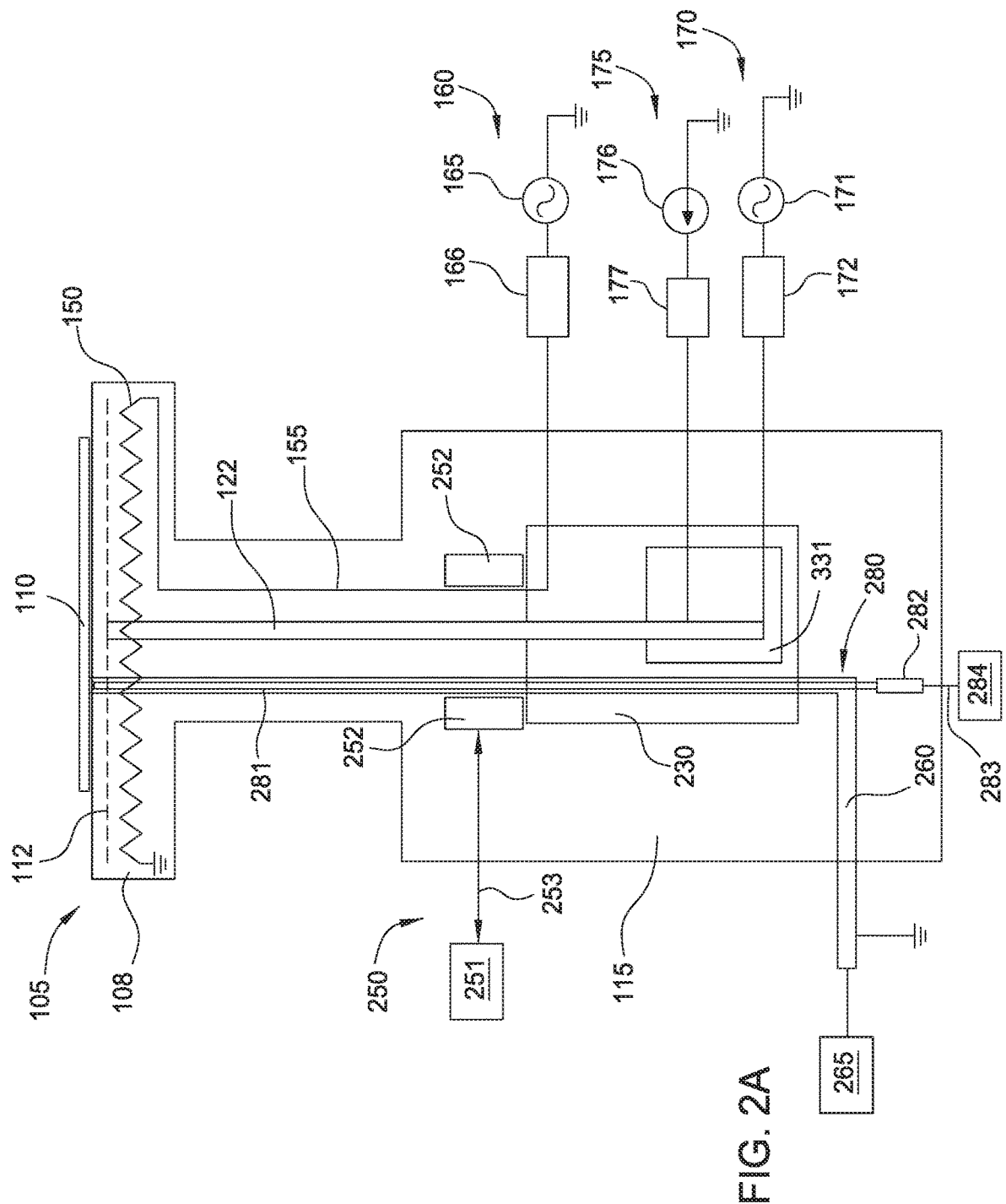
FIG. 2A is a schematic depiction of the substrate support assembly and components that are connected to the substrate support assembly of the plasma processing apparatus of FIG. 1, according to one embodiment.

FIG. 2A is a schematic depiction of the substrate support assembly 105 and components that are connected to the substrate support assembly 105 of the plasma processing apparatus 100, according to one embodiment. The substrate support assembly 105 further includes an interconnect assembly 230. The interconnect assembly 230 can be disposed in the base 115. The interconnect assembly 230 can couple the radio frequency power source 171 and the direct current power source 176 with the electrode 112. The conductive rod 122 that is coupled to the electrode 112 can be coupled with the interconnect assembly 230, so that the RF power source 171 and the DC power source 176 are connected to the electrode 112. The interconnect assembly 230 can also be used to connect the plurality of heating elements 150 with the heating power source 165. The conductive rods 155 connects the plurality of heating elements 150 with the interconnect assembly 230, so that the heating power source 165 can be connected to the plurality of heating elements 150. The interconnect assembly 230 includes additional features described in reference to FIG. 3A below that improve the operation of applying RF power and DC bias to the electrode 112 at elevated temperatures (e.g., temperatures greater than 200° C.). The interconnect assembly 230 may be especially useful for applications that apply a high RF power and a DC bias to the electrode 112 at elevated temperatures (e.g., temperatures greater than 400° C. to 650° C.).

The plasma processing apparatus 100 can further include a cooling assembly 250. The cooling assembly 250 can be used to cool portions of the substrate support assembly 105 during operations at elevated temperatures (i.e., temperatures greater than 200° C.). The cooling assembly 250 can include a coolant source 251 (e.g., a chilled water source), a coolant supply line 253, and a coolant channel 252 (also referred to as channel). The coolant channel 252 can be formed in the base 115 of the of the substrate support assembly 105, and the cooling assembly 250 can be configured to direct coolant to flow through the channel 252 in the base 115 portion of the substrate support assembly 105. The coolant supply line 253 connects the coolant source 251 with the coolant channel 252. In some embodiments, the cooling assembly 250 can be used to maintain the temperature of the base 115 of the substrate support assembly 105 at temperatures below 100° C., such as at temperatures below 75° C., while the substrate support 108 is maintained at a higher temperature (e.g., temperatures greater than 200° C.).

The plasma processing apparatus 100 can further include a gas line 260 (also referred to as conduit) connected to a gas source 265. The gas line 260 can provide an inert gas, such as helium, to the process volume 106. The inert gas can be used to improve the thermal uniformity and heat transfer between the substrate support 108 and the substrate 110 during processing. In some embodiments, the gas line 260 can extend through the interconnect assembly 230. The gas line 260 can be grounded at multiple locations (e.g., near the interconnect assembly 230 and/or near the coolant channel 252) to help prevent the RF power from initiating a plasma in the gas line 260 during operation.

The plasma processing apparatus 100 includes a temperature sensor 280 (e.g., a pyrometer) to monitor a temperature of the substrate 110 during processing. The temperature sensor 280 includes a sensor body 282 disposed in the base 115 of the substrate support assembly 105. The temperature sensor 280 includes a light pipe 281 extending from the sensor body 282 to the top of the substrate support 108. In some embodiments, the light pipe 281 can extend through the gas line 260 by making appropriate connections and seals with the gas line 260 (not shown). Routing the light pipe 281 through the gas line 260 makes it unnecessary to form another conduit through the substrate support assembly 105 to the substrate supporting surface of the substrate support 108. In some embodiments, the light pipe 281 can be formed of sapphire, such as a sapphire probe housed in alumina.

The temperature sensor 280 can further include a controller 284 and a communication cable 283 (e.g., a fiber optic cable). The communication cable provides the signals received at the sensor body 282 (e.g., radiation) to the controller 284. The controller 284 can convert the received signals (e.g., radiation), for example to electrical signals, enabling the temperature of the substrate to be monitored and the controller 284 to communicate the measured temperature with the system controller 134 (see FIG. 1) or another controller. In some embodiments, the system controller 134 can adjust the power provided to one or more of the heating elements 150, so that the temperature of the substrate 110 can be controlled using the feedback of the temperature sensed by the temperature sensor 280.

Figure 2B:
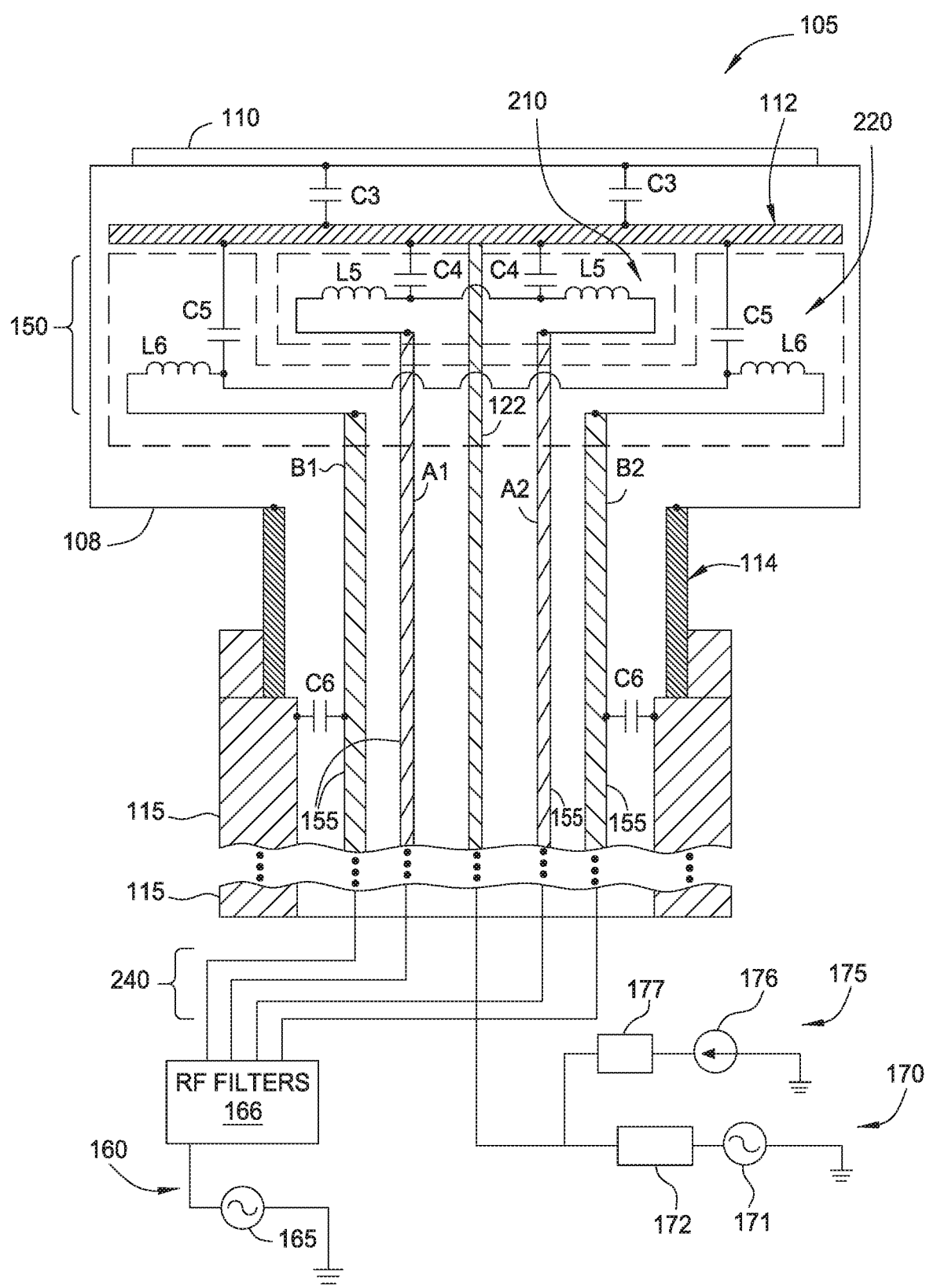
FIG. 2B is a diagram illustrating the electrical interactions between different components in the substrate support assembly of FIGS. 1A and 2A, according to one embodiment.

FIG. 2B is a diagram illustrating the electrical interactions between different components in the substrate support assembly 105, according to one embodiment. The electrical components of the substrate support assembly 105 include the electrode 112 connected to the conductive rod 122 and the heating assembly including the plurality of heating elements 150 connected with the conductive rods 155. During processing a capacitance C3 is created between the electrode 112 and the surface of the substrate support 108 on which the substrate 110 is positioned due to the application of the RF power to the electrode 112. The heating elements 150 may be distributed among a plurality of heating zones that are used to adjust the temperature profile across the substrate 110 during processing. The plurality of heating zones may include an inner zone 210 and outer zone 220. The heating elements 150 are coupled through conductive rods 155 to one or more RF filters 166. The four conductive rods 155 shown in FIG. 2B are referred to as A1, A2, B1, and B2.

In one embodiment, each of the conductive rods 155 is coupled to a respective RF filter 166, which may have the same or different properties. Groups of conductive rods 155 may correspond to different heating zones; for example, rods A1 and A2 correspond to the heating elements of inner zone 210, while rods B1 and B2 correspond to heating elements of outer zone 220. In one embodiment, two conductive rods 155 correspond to a particular zone. For example, the heating power source 165 delivers AC power through RF filters 166 into a first rod of the two rods; the AC power travels through the first rod and heating elements 150 before returning through the second rod and RF filters 166 to ground.

Components of the heating assembly will generally have a non-zero impedance that reflects both the intrinsic electrical properties of the components and the proximity to other components in the substrate support assembly 105 or from other portions of the plasma processing apparatus 100. For example, heating elements 150 and conductive rods 155 may couple RF energy from the electrode 112 and conductive rod 122 during operation. The resistive portion of components' impedance is typically a non-zero value that is not affected by changes in operating frequency and is not able to be compensated for during processing. Therefore, for ease of description, resistive components are not depicted in this figure.

The impedance of the heating elements 150 and conductive rods 155 may thus be modeled as including an inductive element and a capacitive element that reflect the RF coupling to one or more components. For example, the impedance of rod A1 includes a capacitance C4 reflecting a coupling of rod A1 with the electrode 112 and conductive rod 122, and includes an inductance L5 reflecting inductive properties of the inner zone 210 heating elements and the rod A1, as well as the inductive coupling caused by relatively large current flow through the conductive rod 122. Rod A2 may generally have the same electrical properties as rod A1 and may be disposed similarly, so that rod A2 is also modeled with capacitance C4 and inductance L5. Of course, rods B1 and B2 may share electrical properties, which may differ from rods A1 and A2, and thus rods B1 and B2 and outer zone 220 heating elements may each be modeled using a capacitance C5 and an inductance L6.

As shown, each of rods B1 and B2 also include a capacitance C6 that represents a coupling between the rod and the typically grounded stem 114 and/or base 115. As rods A1 and A2 may have electrical properties and dispositions differing from rods B1 and B2, rods A1 and A2 may also have a coupling (not shown) with the stem 114 and/or base 115 that may differ from capacitance C6, or may be negligibly small.

To provide greater efficiency and greater control of the application of RF energy for depositing films onto or removing material from a substrate, ideally a maximum amount of the RF energy delivered by the electrode 112 will be coupled through the wall of the chamber body 102 and gas distribution manifold 118 to ground, with no charge coupled into the heating assembly or into other components (i.e., RF leakage). Therefore, it is advantageous to increase the impedance of the heating assembly (e.g., heating elements 150 and one or more conductive rods). As discussed above, the components may all include some real, non-zero impedance (i.e., resistance) that cannot be compensated for during processing. However, the reactance of different components may be controlled by adjusting capacitive or inductive elements within the heating assembly.

To increase the impedance of the heating assembly, one or more RF filters 166 are coupled to the conductive rods 155 (as shown, rods A1, A2, B1, B2). The RF filters are either low-pass filters or band-stop filters that are configured to block RF energy from reaching the heating power source 165.

The RF filters 166 may be coupled to the conductive rods 155 though conductive connections 240 near the base 115. In one embodiment, the connections 240 may include a short rigid lead for each rod 155, so that each RF filter 166 is directly coupled to each respective rod 155 or disposed proximate to the base 115 and to the respective rods 155. Further, each connection 240 may be maximally spaced apart to minimize capacitive coupling between connections. It is believed that connections that include a flexible and/or shielded multi-conductor cable disposed between the rods 155 and the filter 166 may introduce additional impedance and may provide a shunt path for RF or other signals, as each conductor will have resistive properties and may have coupling with the other conductors and with the grounded shield. Therefore, in some embodiments, it is desirable to position the RF filter 166 as close to the rods 155 as mechanically feasible, and in some cases directly coupling the RF filter 166 to each of the rods 155.

Figure 3A:
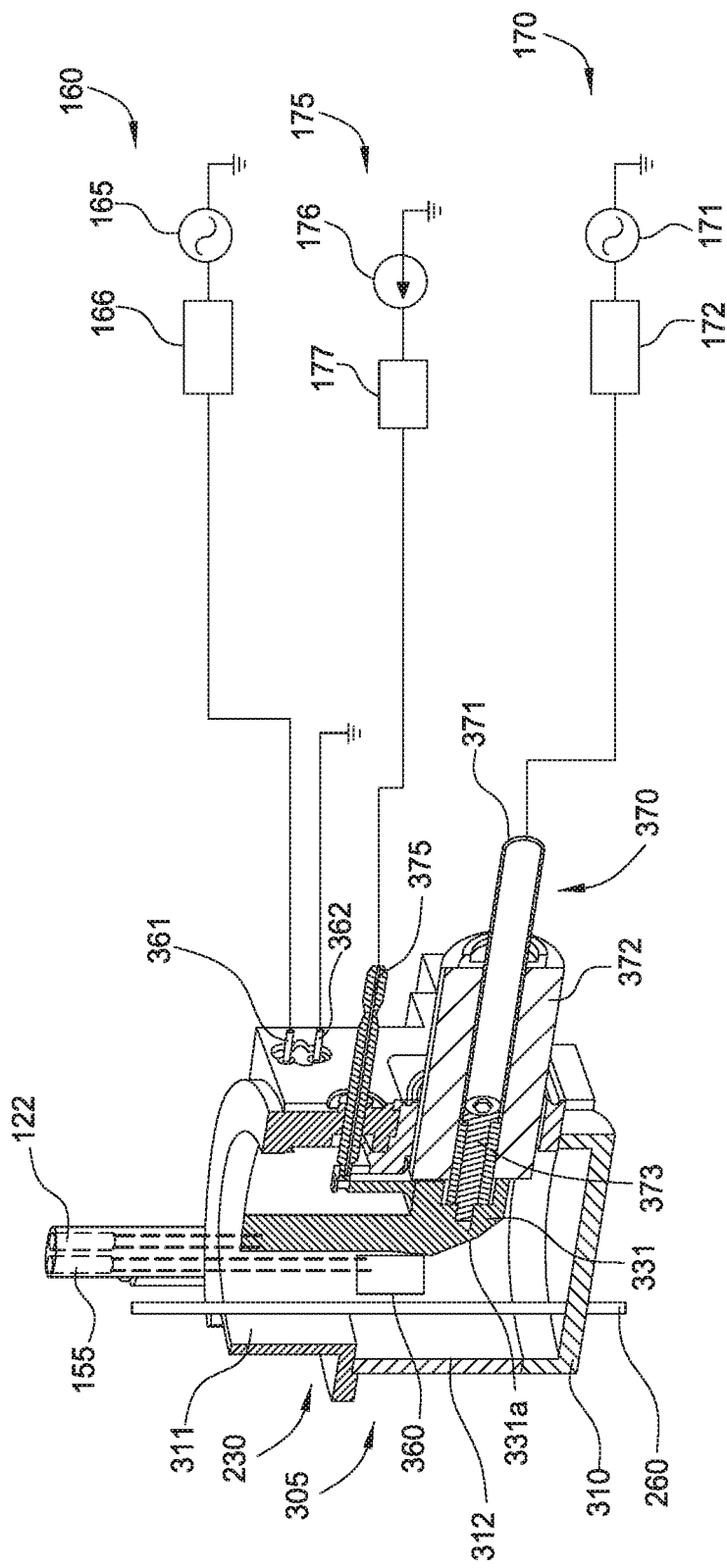
FIG. 3A is a schematic depiction of the interconnect assembly of FIG. 2A and components that are connected to the interconnect assembly of the substrate support assembly of FIG. 2A, according to one embodiment.

FIG. 3A is a schematic depiction of the interconnect assembly 230 and components that are electrically connected to the interconnect assembly 230 of the substrate support assembly 105, according to one embodiment. The interconnect assembly 230 connects the RF power source 171 and the DC power source 176 with the conductive rod 122 that is coupled to the electrode 112. The interconnect assembly 230 further connects the heating power source 165 with the conductive rods 155 that are coupled to the plurality of heating elements 150. Only one conductive rod 155 is shown here for clarity.

The interconnect assembly 230 includes a housing 305. The housing 305 can include a first portion 311 forming an upper portion of the housing 305, a second portion 310 forming a lower portion of the housing 305, and a third portion 312 disposed between the first portion 311 and the second portion 310. The housing 305 can be formed of a metallic material, such as an alloy, for example an aluminum 6061 alloy.

The interconnect assembly 230 can further include an interconnect 331. The first interconnect 331 can be used to make electrical contact with the RF circuit 170 and the DC circuit 175. The interconnect 331 can be formed of an insulated metallic material, such as copper coated with polyimide or a silver coated conductive material that is coated with a dielectric coating.

The interconnect assembly 230 further includes a first conductor 370 that couples the first interconnect 331 with the RF circuit 170. The first conductor 370 can include a first conductive rod 371 and an insulator 372 surrounding the first conductive rod 371. The first conductive rod 371 can be a hollow rod. The first conductive rod 371 may be formed of a metallic material, such as plated copper, such as copper plated with silver (Ag). The insulator 372 can be formed of an insulating material, such as polytetrafluoroethylene (PTFE). The first conductive rod 371 can further include a connector 373 that can fasten or otherwise couple the first conductive rod 371 to the first interconnect 331. In one embodiment, the connector 373 can be a fastener, such as a brass bolt. The connector 373 can make contact with the first interconnect 331 in a recess 331a of the first interconnect 331 so that this point of electrical contact is shielded from the portion of the first interconnect 331 that is used to make electrical contact with the DC circuit 175.

The interconnect assembly 230 further includes a second conductive rod 375 that couples the first interconnect 331 with the DC circuit 175. The second conductive rod 375 can be formed of a conductive material (e.g., copper) that is surrounded by an insulator (e.g., PTFE).

In some embodiments, the conductive rods 122, 155 can extend into a portion of the interconnect 331 so that the electrical connections can be made between the conductive rods 122, 155 and the respective circuits (i.e., circuits 170, 175 for the conductive rod 122 and circuit 160 for the conductive rods 155). In one configuration, one or more of the conductive rods extend into a portion of the interconnect 331 that includes one or more threaded set screws (not shown) that are disposed within the portion of the interconnect 331, and thus allow a robust electrical connection to be formed when the setscrews are tightened so as to physically contact a portion of the inserted conductive rod disposed within the portion of the interconnect 331 and mating threads formed in the portion of the interconnect 331. In other embodiments, one or more of the conductive rods 122, 155 may be connected to a flexible conductor in the interconnect assembly 230, such as a pigtail, allowing the conductive rods 122, 155 to expand and contract during the heat cycling that occurs in the plasma chamber, which can help prevent any disruption to the corresponding electrical connections or electrical arcs that may occur if a rigid electrical connection is used in an elevated temperature environment that typically cycles between room temperature and the elevated temperature during normal operation and maintenance activities.

The interconnect assembly 230 further includes a receptacle 360 for coupling the heating circuit 160 to the plurality of heating elements 150. In one embodiment, the receptacle can be a junction box, such as a junction box formed of an insulating material, such as polyether ether ketone (PEEK). The interconnect assembly 230 can further include a first heater conductor 361 and a second heater conductor 362. The first heater conductor 361 can extend through an opening in the first portion 311 of the housing 305 to connect the power from the heating circuit 160 to the receptacle 360. The second heater conductor 362 can extend through another opening in the first portion 311 of the housing 305 to provide a ground a connection to the receptacle 360.

Figure 3B:
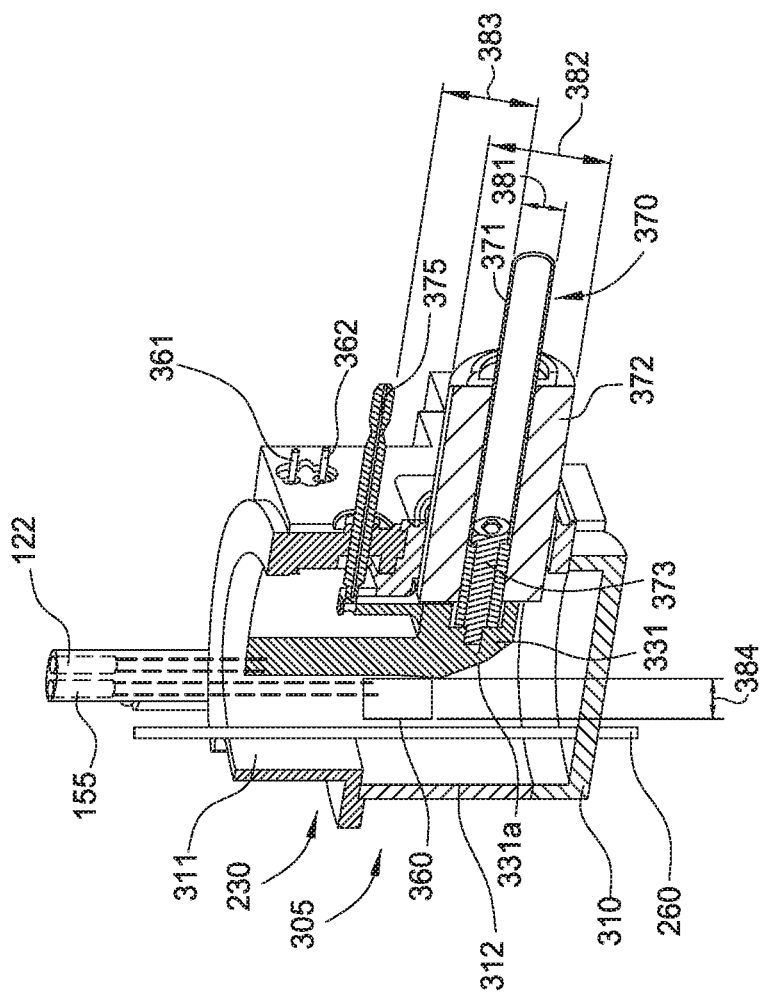
FIG. 3B is another schematic depiction of the interconnect assembly of FIG. 2A, according to one embodiment.

FIG. 3B is a schematic depiction of the interconnect assembly 230, according to one embodiment. The depiction in FIG. 3B provides details on dimensions of different components in the interconnect assembly 230. For example, the first conductive rod 371 is a hollow rod having an inner diameter 381 from about 10 mm to about 50 mm, such as about 25 mm. In one configuration, the first conductive rod 371 is tubular in shape and has a wall thickness ($t_w$), which is measured in the radial direction, of between about 0.5 mm to about 5 mm, such as between about 1 mm and about 3 mm. In some embodiments, the size of the inner diameter 381 may be related to the power of the RF signal from the RF circuit 170, such as an inner diameter 381 that sized to compensate for the amount of RF power that is provided through the first conductive rod 371. The size of the inner diameter 381 and outer diameter (e.g., inner diameter 381+ 2×$t_w$) increases the surface area through which the RF current from the RF circuit 170 can flow. The increasing surface area can be used to reduce the "skin effect" which is a tendency of an alternating current to become distributed within a conductor such that the current density is largest near the surface of the conductor, such as the first conductive rod 371. The "skin effect" causes the effective resistance of the conductor to increase at high frequencies (e.g., radio frequencies). By increasing the surface area, the current around the skin (e.g., surface) of the first conductive rod 371 has a larger cross-sectional area through which to flow and thus the effective resistance is reduced. In some embodiments a power ratio of the RF power from the RF circuit 170 to the diameter 381 of the first conductive rod 371 can be useful for determining appropriate dimensions of the first conductive rod 371. For example, in some embodiments the power ratio of RF power relative to the diameter 381 of the first conductive rod 371 can be from about 4 W/mm to about 60 W/mm, such as about 30 W/mm. In some embodiments, the first conductive rod 371 is designed to have desired power to surface area ratio per unit length of the first conductive rod 371 that is between about 0.1 W/mm$^2$ to about 75 W/mm$^2$, such as between about 1 W/mm$^2$ and about 10 W/mm$^2$, where the unit length is in millimeters (mm).

The insulator 372 surrounding the first conductive rod 371 can have an outer diameter 382 from about 50 mm to about 250 mm, such as about 100 mm. Furthermore, the second conductive rod 375 can be spaced apart from the first conductive rod 371 by a distance 383 of at least 5 cm, such as by at least 15 cm, at the locations where the first conductive rod 371 and the second conductive rod 375 make contact with the interconnect 331. Also, the gas line 260 can be spaced apart from any portion of the interconnect assembly 230 and first conductive rod 371 by a distance 384 of at least 6 mm, such as by at least 10 mm to prevent any unintentional creation of plasma in the gas line 260.

While the foregoing is directed to embodiments of the present disclosure, other and further embodiments of the disclosure may be devised without departing from the basic scope thereof, and the scope thereof is determined by the claims that follow.

The invention claimed is:
1. A plasma processing apparatus, comprising:
a substrate support assembly comprising:
a substrate support having a substrate supporting surface and a bottom surface;
an electrode disposed in the substrate support;
a base disposed below the substrate support, the base having a top surface; and
a stem extending in a vertical direction between the top surface of the base and the bottom surface of the substrate support, the stem connecting the base to the substrate support;
an interconnect assembly disposed inside the base, the interconnect assembly comprising an interconnect electrically connected with the electrode; and
a coolant channel disposed inside the base, wherein the coolant channel is configured to allow a cooling fluid to flow through the base without flowing through the substrate support.

2. The plasma processing apparatus of claim 1, wherein the substrate support assembly further comprises a coolant channel disposed inside the base, and
the coolant channel is configured to allow a cooling fluid to flow through the coolant channel.

3. The plasma processing apparatus of claim 2, wherein the coolant channel is disposed between the interconnect assembly and the stem.

4. The plasma processing apparatus of claim 1, wherein the substrate support assembly further comprises a conduit configured to provide a gas to the substrate supporting surface.

5. The plasma processing apparatus of claim 4, further comprising a temperature sensor extending through the conduit to the substrate supporting surface.

6. The plasma processing apparatus of claim 5, further comprising:
a heating element disposed in the substrate support.

7. The plasma processing apparatus of claim 1, further comprising:
a first conductive rod electrically connected to the interconnect, the first conductive rod being hollow.

8. The plasma processing apparatus of claim 7 further comprising a second conductive rod electrically connected to the interconnect.

9. The plasma processing apparatus of claim 8, wherein the second conductive rod is spaced apart from the first conductive rod by at least 5 cm at the locations where the first conductive rod and the second conductive rod make contact with the interconnect.

10. The plasma processing apparatus of claim 1, wherein the interconnect comprises a metallic material coated with polyimide.

11. The plasma processing apparatus of claim 1, wherein the substrate support assembly further comprises a heating element disposed in the substrate support, wherein the heating element is electrically isolated from the electrode.

12. The plasma processing apparatus of claim 11, further comprising:
a radio frequency filter coupled to the heating element.

13. A plasma processing apparatus, comprising:
a radio frequency power source;
a direct current power source;
a chamber enclosing a process volume;
a substrate support assembly disposed in the process volume, comprising:
a substrate support having a substrate supporting surface;
an electrode disposed in the substrate support; and
an interconnect assembly coupling the radio frequency power source and the direct current power source with the electrode;
a cooling assembly, wherein the substrate support assembly further comprises a channel coupled to the cooling assembly and the cooling assembly is configured to direct a cooling fluid to flow through the channel;
a gas source, wherein the substrate support assembly further comprises a conduit coupling the gas source to the substrate supporting surface; and
a pyrometer having a light pipe extending through the conduit to the substrate supporting surface.

* * * * *